May 17, 1966 R. G. KEPLER ET AL 3,252,061

CIRCUIT COMPONENTS

Filed Feb. 2, 1960

INVENTORS
RAYMOND GLEN KEPLER
MONROE S. SADLER

BY James H. Ryan

ATTORNEY

United States Patent Office 3,252,061
Patented May 17, 1966

3,252,061
CIRCUIT COMPONENTS
Raymond Glen Kepler, Claymont, and Monroe S. Sadler, Wilmington, Del., assignors to E. I. du Pont de Nemours and Company, Wilmington, Del., a corporation of Delaware
Filed Feb. 2, 1960, Ser. No. 6,167
16 Claims. (Cl. 317—235)

Figure 1:
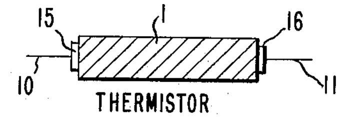

This invention relates to new energy control and/or energy transfer circuit components and to improved electronic devices based thereon. More particularly, the invention relates to single-crystal circuit components of charge-transfer compounds of organic or organo-inorganic Lewis acids and Lewis bases and to electronic devices based thereon.

Since the invention of the transistor in 1948, a new branch of electronics has emerged, leading to a wide range of circuit devices which supplement, and in many cases replace completely, existing vacuum tubes and devices based thereon. Modern semiconductor technology to support this new branch of electronics deals almost exclusively with the preparation of monocrystalline specimens of inorganic semiconducting materials, mostly germanium and silicon, and the controlled addition of extremely minute amounts of impurities to these crystals to make the required rectifiers, transistors, photocells, and the like. Fundamental to this technology is the necessity of obtaining silicon and germanium at purity levels previously not even considered possible. Similarly, special crystal-growing techniques had to be devised to afford the previously unobtainable large single crystals of these relatively high melting elemental metalloids.

While these two technological problems have been solved and are handled normally today on production scale levels, they are obviously complicated and cannot help but add to the costs of the already expensive materials involved. Furthermore, the high temperature techniques necessarily used severely limit the degree of flexibility in crystal-growing techniques, both as to shape fabrication and as to the degree of control possibly applicable to the electronic properties of the doped crystals.

A principal object of the present invention, accordingly, is the provision of components for electrical circuits which can be formed with relative ease.

A further object is the provision of electrical circuits containing the novel components.

In the furtherance of the above-mentioned and yet other objects of the invention, there are now provided circuit elements formed from single crystals of organic and/or organo-inorganic Lewis acid/Lewis base charge-transfer compounds, usually having an acid/base mole ratio of 2/1–1/2. The single crystals can be readily obtained at room temperatures or thereabouts by relatively simple techniques from solutions of the charge-transfer compounds. Such single crystals of the charge-transfer compounds which exhibit a detectable paramagnetic resonance absorption at temperatures in the range −100° C. to +150° C. are useful as energy control and/or energy transfer circuit components and in the preparation of electronic devices based thereon.

In the foregoing and throughout this specification the term "single crystal" is used in its art-recognized sense as meaning an integral body of solid matter containing an ordered periodic arrangement of atoms which extends unchanged throughout the body without discontinuity or change of orientation.

By virtue of the very wide variations possible in the electronic character of both the organic and organo-inorganic Lewis acid and organic and organo-inorganic Lewis base components arising through the fundamental changes in electronic properties due to the different substituents easily and reproducibly substituted in both the Lewis acid and Lewis base components, the single-crystal, charge-transfer circuit components can be fabricated with a very wide range of electronic properties as desired. These single-crystal circuit components are unique in exhibiting highly anisotropic electrical characteristics at normal temperatures. Obvious advantages of both cost and convenience reside in the important fact that these single-crystal circuit components can be prepared at such modest temperatures, most conveniently in the range of room temperature or thereabouts.

In the foregoing statement of the devices of the present invention, and in the more detailed discussions which follow, the heart of the invention is regarded as the single-crystal, charge-transfer circuit components which exhibit a detectable paramagnetic resonance absorption. The literature has described many related materials useful to form circuit components but only in powder, polycrystalline form, of obvious disadvantage in circuit fabrication, referring to them frequently as Pi complexes. More recently, the concept has become well established that such complexes are more properly described as charge-transfer compounds (see, for instance, Mulliken, J. Am. Chem. Soc. 74, 811 (1952)).

The invention is generic to a wide variety of charge-transfer, single-crystal, circuit components from organic and organo-inorganic Lewis acids and Lewis bases which exhibit a detectable paramagnetic resonance and includes those formed from compounds—or adducts—ranging in degree of charge transfer from those of true complex structure to those where actual and complete charge transfer exists in the ground electronic state of the compound. Compounds of the last-mentioned type constitute so-called anion radical pairs, wherein at least one molecule of the Lewis acid component of the charge-transfer compound will carry the transferred and accepted electron and, accordingly, a negative electronic charge, and at least one molecule of the Lewis base component will have donated at least one electron to the Lewis acid component and will accordingly have an electron deficiency and, therefore, a positive electronic charge. While charge-transfer compounds are known wherein the maximum charge transfer occurs not in the ground electronic state but rather in the excited state (see Orgel, Quart. Rev. Chem. 8, 1422 (1954) for a discussion of these diamagnetic charge-transfer compounds), the present invention in its single-crystal circuit component aspect is generic only to the subgenus of the charge-transfer compounds which exhibit a detectable paramagnetic resonance absorption.

Lewis acids and Lewis bases, the precursors of the compounds used, in the form of single crystals, as circuit components in the immediate invention, are themselves compounds well known to the chemical arts (see G. N. Lewis, Journal of the Franklin Institute, 226, 293 (1938)). Preferred Lewis acids and Lewis bases for use in this invention are aprotonic and anhydroxidic, respectively.

A Lewis acid is, by definition, simply a molecule, the structure or configuration of which, electronically speaking, is so arranged that the molecule is capable of accepting one or more electrons from a molecule which is capable of donating said electrons, i.e., has an electron-abundant structure. Many and varied electron acceptor compounds are known. As noted above, preferred Lewis acids are aprotonic, that is, free of ionic hydrogen, i.e., $H^+$: see U.S. Patents 3,062,836 and -837.

To list but a few well-recognized organo and organo-inorganic classes of Lewis acids, there can be named the polycyano- and pollynitro-substituted ethylenes carrying also a plurality of halogen or nitroso substituents, e.g.,

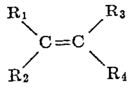

where $R_1=R_3$ and are pairwise CN or $NO_2$ and $R_2=R_4=$ CN, NO, or halogen;

the polycyano-, polyhalo-, or polynitro-substituted ortho-, i.e., 1,2-, aromatic quinones carrying, if desired, in addition to at least two cyano or two nitro ring substituents up to two hydrogens or nitroso substitutents on ring carbon, e.g.,

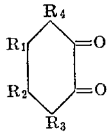

where $R_1=R_2=R_3=R_4=$CN or halogen, when any two are CN then the other two can be halogen or hydrogen or NO, and when $R_3=R_4=NO_2$, then $R_1$ and/or $R_2$ can be hydrogen, halogen, CN, or NO;

the polycyano, polyhalo, polynitroso, and polynitro para-, i.e., 1,4-, aromatic quinones, e.g.,

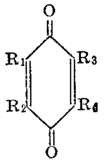

where $R_1=R_2=R_3=R_4=$CN or halogen, when $R_1=R_2=$ CN then $R_3$ and/or $R_4$ can be hydrogen, halogen, or No, when $R_1=R_3=$CN or halogen then $R_2$ and $R_4$ can be NO or $NO_2$, and when $R_1=R_3=$CN then $R_2$ and $R_4$ can be halogen or hydrogen;

the 1,4-bis(dicyanomethylene)-2,5-cyclohexadienes carrying, if desired, one or more halogen, cyano, nitroso, or nitro substituents on the 2, 3, 5, and/or 6 ring carbons, e.g.,

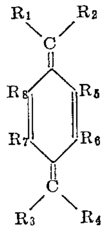

where $R_1=R_2=R_3=R_4=$CN and $R_5$ through $R_8=$hydrogen, halogen, CN, or NO, when $R_5=R_7=NO_2$ then $R_6=R_8=$hydrogen, and when $R_5=R_8=NO_2$ then $R_6=R_7=$hydrogen;

the polycyano- and polynitro-substituted cyclobut-3-en-1,2-diones, e.g.,

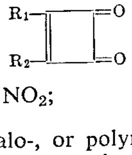

where $R_1=R_2=$CN or $NO_2$;

the polycyano-, polyhalo-, or polynitro-substituted polycyclic aromatic quinones, e.g., the 2,3-dicyano-1,4-naphthoquinones, carrying four halogens or two or more cyano substituents on the benzo ring, the polycyano- and polyhalo-substituted 9,10-anthraquinones, e.g., 9,10-anthraquinones carrying four halogen substituents or two or more cyano substituents on each benzo ring, the hexacyano-3,8- or -3,10-pyrenequinones; the polycyano-, polyhalo-, and/or polynitro-substituted polycyclic aromatic polyqinones, e.g., the hexacyano-3,10,4,9-perylenediquinones, e.g., 1,2,5,7,8,11-hexacyano-3,10,4,9-perylenediquinone; polynitro- and polynitroso-substituted aromatic hydrocarbons, and the like.

In all the foregoing instances the halogen substituents there discussed are expressly inclusive of all the four normal halogens running from atomic weight 19 through 85 i.e., fluorine, chlorine, bromine, and iodine. Likewise, in all the foregoing instances the molecular structure can also carry functional substituents which are electronegative. These substituents can also be classed as those which, when present on ring carbon of an aromatic nucleus, tend to direct any entering substituent radical into the meta-position with respect to the said functional substituent, i.e., the so-called meta-orienting groups. These substituents also have been described by Price, Chem. Rev. 29, 58 (1941), in terms of the electrostatic polarizing force as measured in dynes of the said substituent groups on an adjacent double bond of the benzene nucleus. Quantitatively, any substituent which has or exhibits an electrostatic polarizing force in dynes less than 0.50 can be regarded as ortho, para-orienting and electropositive and accordingly is not permitted here. Conversely, any substituent exhibiting a polarizing force in dynes greater than 0.50 can be regarded as electronegative and meta-orienting and is permitted as a functional substituent on the Lewis acids here involved. These permitted substituents include sulfo, chloroformyl, trifluoromethyl, methylsulfonyl, carboxy, hydrocarbyloxy-carbonyl, formyl, nitromethyl, and the like.

Suitable specific Lewis acids for making the Lewis acid/Lewis base charge transfer compounds in molar ratios from 2/1 to 1/2 include such polycyanoethylenes as tetracyanoethylene; polycyanopolynitroso-substituted ethylenes such as 1,2-dicyano-1,2-dinitrosoethylene, which actually exists in the tautomeric ring form as dicyanofuroxan; polyhalo-substituted o-quinones such as fluoranil, i.e., tetrafluoro-o-quinone, chloranil, i.e., tetrachloro-o-quinone, bromanil, i.e., tetrabromo-o-quinone, iodanil, i.e., tetraiodo-o-quinone; polycyano-substituted quinones such as 2,3 - dicyano-p-quinone; halocyano-substituted quinones such as 2-chloro-5,6-dicyano-1,4-benzo-quinone; polyhalo-substituted polycyano-substituted quinones such as 2,3-dichloro-5,6-dicyano-1,4-benzoquinone; polycyano-substituted quinones such as 2,3,5,6-tetracyano-1,4-benzo-quinone; 1,4-bis(dicyanomethylene)-2,5-cyclohexadienes and the polycyano-substituted derivatives thereof such as 7,7,8,8-tetracyanoquinodimethane and 2,3,5,7,7,8,8-octacyanoquinodimethane; polycyano-substituted cyclobutenones such as 2,3-dicyanocyclobuten-3-one; polyhalopolynitroquinones such as 2,5-dichloro-3,6-dinitro-1,4-benzoquinone; and polynitro- and nitroso-substituted aromatic hydrocarbons, e.g., hexanitroso-benzene; and the like.

A Lewis base is, by definition, simply a molecule, the structure or configuration of which, electronically speaking, is so arranged that the molecule is capable of donating one or more electrons to a molecule which has an electron-deficient structure but, as noted above, preferred Lewis bases for use in this invention are anhydroxidic, that is, free of ionic hydroxyl, i.e. $OH^-$. Many and varied electron donor compounds are known. To list but a few well-recognized and preferred organo and organo-inorganic classes there can be named: the amines and various alkyl and aryl hydrocarbon-substituted amines which may be described structurally by the following two formulae:

where $R_1$, $R_2$, $R_3$ are hydrogen, alkyl, or alkylene up to 10 carbons and when $R_1$ is aryl, $R_2$ and $R_3$ are hydrogen or alkyl up to 10 carbons,

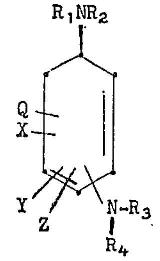

where the amino substituents are ortho or para to each other and $R_1$, $R_2$, $R_3$, $R_4$, are alkyl up to 10 carbons and Q, X, Y, 6 are hydrogen or hydrocarbon up to 10 carbons, which can be together joined, or other ortho- or para-directing substituents with the proviso that (1) when $R_1$, $R_2$, $R_3$ and $R_4$ are alkyl, Q and X are hydrogen, (2) when $R_1$ and $R_3$ are aryl, $R_2$ and $R_4$ are hydrogen or alkyl, and (3) where Q–X and/or Y–Z taken pairwise are cyclo-alkylene or fused aromatic, $R_1$ and $R_3$ are hydrogen;

(In the foregoing diamines it is expressly intended to include polynuclear diamines in which the nitrogens are connected by a conjugated system.) The phosphines and alkyl or aryl hydrocarbon-substituted phosphines:

where $R_1$, $R_2$, and $R_3$ are alkyl or aryl up to 10 carbons (the aryls being unsubstituted or having o- and p-directing substituents),

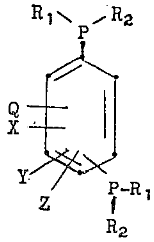

where $R_1$, $R_2$, Q, X, Y, and Z are as above in the aryl amine analogs except that $R_1$ and $R_2$ cannot be hydrogen;

the arsines and alkyl and aryl hydrocarbon-substituted arsines:

where $R_1$, $R_2$, and $R_3$ are as above in the phosphine analogs,

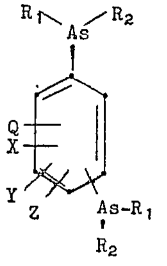

where $R_1$, $R_2$, Q, X, Y, and Z are as above in the aryl phosphine analogs;

the stibines and alkyl and aryl hydrocarbon-substituted stibines:

where $R_1$, $R_2$, and $R_3$ are as above in the arsine analogs,

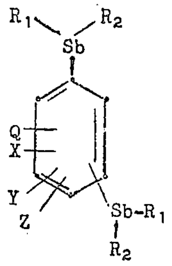

where $R_1$, $R_2$, Q, X, Y, and Z are as above in the aryl arsine analogs;

the quaternary ammonium bases or their salts, such as $R_1R_2F_3R_4N^{\oplus}$ where $R_1$, $R_2$, $R_3$, and $R_4$ are H or alkyl up to 10 carbons; metal cations describable by $M^{+x}$ where M is a metal and $x$ is the formal cationic valence of the metal; metal chelates having square planar configuration, the atoms which coordinate with the metal being joined by a conjugated system of double bonds (aromatic or open chain); aromatic or heterocyclic aromatic amine, phenols or ethers, the O and N atoms being connected by a conjugated system of double bonds; aromatic hydrocarbon or alkyl-substituted aromatic hydrocarbons including polynuclear ones; and polyhydric phenols and ethers thereof.

In all the foregoing instances, the molecular structure in the hydrocarbon moieties can also carry such functional substituents which are not electronegative, i.e., are electropositive. These substituents can also be classed as those which, when present on ring carbon of an aromatic nucleus, tend to direct any entering substituent radical into the ortho- or para-position, i.e., the so-called ortho-para orienting groups. These substituents have also been described by Price, Chem. Rev. 29, 58 (1941), in terms of the electrostatic polarizing force as measured in dynes of the said substituent groups on an adjacent double bond of the benzene nucleus. Quantitatively, any substituent which has or exhibits an electrostatic polarizing force in dynes less than 0.50 can be regarded as ortho-para orienting and electropositive, and is permitted here. Conversely, any substituent exhibiting a polarizing force in dynes greater than 0.50, as per the same Price article, can be regarded as electronegative and meta-orienting, and is not permitted as a functional substituent in the Lewis bases here involved. These permitted substituents include: alkyl hydrocarbon up to 10 carbons; substituted alkyl up to 10 carbons, e.g., aminoalkyl, hydroxyalkyl, alkoxyalkyl, vinylalkyl, haloalkyl; hydroxy; alkoxy up to 10 carbons; thiol, alkyl thiol (up to 10 carbons); amino; n-alkylamino or N,N-dialkylamino with alkyls up to 10 carbons; N-monoarylamino; and the like.

Suitable specific Lewis bases for making the Lewis acid/base charge transfer compounds in molar ratios from 2/1 to 1/2 acid-base include: ammonia and amines, such as ammonia, methylamine, dibutylamine, tridecylamine, and the like; diamines, such as 2,3-N,N,N′,N′-hexamethyl-p-phenylenediamine, N,N′-dioctyl-1,5-diaminonaphthalene,1,4-diamino-5,6,7,8-tetrahydronaphthalene, and the like; phosphines and diphosphines, such as triphenylphosphine, tributylphosphine, ethyldioctylphosphine, 1,4-bis-(diethylphosphino)benzene, and the like; ammonium and quaternary ammonium bases and salts, such as ammonium iodide, ethyltrimethylammonium iodide, dioctylammonium iodide, methyltri-n-propylammonium iodide, tetramethylammonium hydroxide, and the like; metal carbonyls such as iron and cobalt carbonyls; metal chelates, such as copper salicylaldimine, cobalt pyrrolealdehydeimine, nickel 4-methoxy-salicyladoxime, copper 5-methoxy-8-quinolinolate, and the like; heterocyclic aromatic amines, phenols, and ethers, such as 4-aminopyridine, 3-hydroxyacridine, 3-dimethylaminocarbazole, 2-methoxyphenazine, and the like; aromatic hydrocarbon ethers, such as phenetidine, N,N-diethylanisidine, and the like; aromatic hydrocarbons and alkyl substituted aromatic hydrocarbons, including polynuclear, such as crysene, coronene, hexamethylbenzene, 2-ethylphenanthrene, and the like.

A charge-transfer compound can readily be prepared by contacting an organic or organo-inorganic Lewis acid and an organic or organo-inorganic Lewis base of the types named above, generally in an inert reaction medium. Heretofore, the charge-transfer compounds have generally been prepared in a polycrystalline state, i.e., as a mass of microscopic crystals. If, however, crystals are permitted to form slowly from the inert medium, single crystals of a size appropriate to the formation of electronic circuit components can readily be obtained. The production of the crystals will be evident from the working examples shown in detail below.

When crystals of sufficient size have been obtained, they can readily be adapted to utility in an electrical circuit. If the crystals are very large, they can be cut as desired. Generally, however, circuit elements can be formed directly from the crystals merely by establishing electrical contact therewith as by attaching electrically conducting leads thereto.

Some specific circuit elements formed from single crystals of charge-transfer compounds and circuits employing the same are shown in the drawings. The drawings are largely schematic. It will be readily understood that conventional encapsulating or other strengthening means can be supplied as desired.

Figure 2:
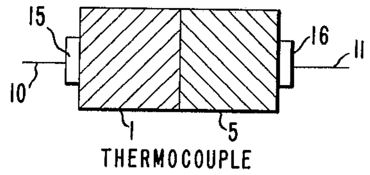
Figure 3:
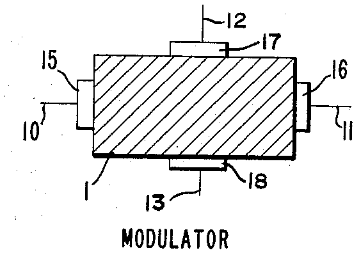
Figure 4:
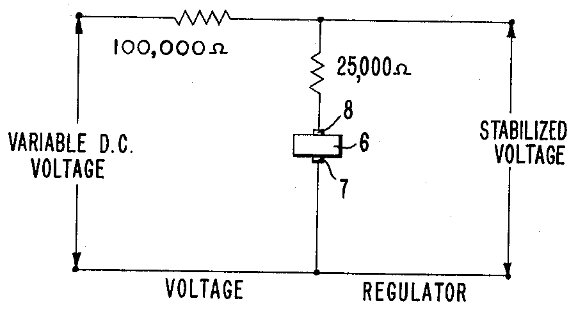
Figure 5:
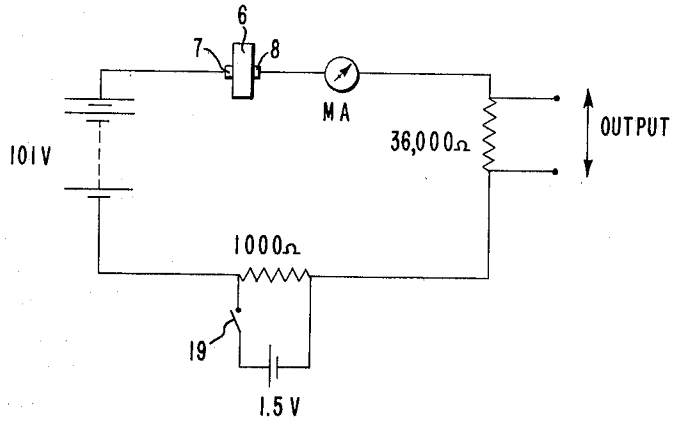

FIGURE 1 shows a section of a charge-transfer single crystal used as a thermistor. Numeral 1 represents the crystal itself, numerals 10 and 11, leads, and 15 and 16, discrete electrodes of material, e.g., electrically conductive cement, bonding the leads to the cyrstal;

FIGURE 2 is a section of a thermocouple employing a charge-transfer single crystal (1) and a metal (5), e.g., silver, platinum or the like;

FIGURE 3 is a section of an anisotropic semiconducting device usable as a modulator wherein the charge-transfer single crystal is connected with the four leads 10, 11, 12 and 13 at different respective opposite pairs of crystal faces by means of contact materials 15, 16, 17 and 18. Here conductivity between leads 10 and 11 differs from that between leads 12 and 13. A current between leads 10 and 11 will cause a voltage to appear between leads 12 and 13. Either or both pairs of leads may be electrically insulated from the crystal. The current or voltage between one pair of leads is modulated by a current or voltage across the second pair of leads;

FIGURE 4 shows a voltage regulator circuit employing a charge-transfer single crystal 6 mounted within electrodes 7 and 8. Resistors and the source of varying D.C. voltage are conventional; and FIGURE 5 shows an amplifier circuit employing a charge-transfer single crystal 6 mounted within electrodes 7 and 8, the amplification action being triggered by key 19.

It will be observed that some of the devices of the figures may have more than one utility. Thus that of FIGURE 1 may be used as a radiation detector as well as a thermistor or thermoelectric generator. The device of FIGURE 2 may also serve as a thermoelectric generator, wherein the voltage developed is employed as a source of power, or a thermoelectric heat pump, in which an electric current passed through the device results in a transfer of heat from one component to the second.

The thermistor properties of the single-crystal, charge-transfer compounds render them useful as circuit components in circuits for temperature compensation of resistance, microwave power measurements, flowmeters, time delays, negative resistance amplifiers, oscillators, multivibrators and modulators. The semiconductor properties of the single-crystal, charge-transfer compounds render them also useful as active circuit elements in junction transistors or in junction diodes or rectifiers.

The following examples are submitted to illustrate the invention further but not to limit it.

*Example I*

(A) A solution of 0.62 part of chloranil in about 370 parts of anhydrous boiling chloroform was allowed to cool to 50° C. and a room-temperature solution of 0.40 part of diaminodurene in about 75 parts of anhydrous chloroform was added thereto at once. The glass reaction vessel was then closed, and the reaction mixture was allowed to stand therein at room temperature for six hours. Upon filtration, there was obtained 0.8 part (about 80% of theory) of the 1/1 chloranil/diaminodurene charge-transfer compound as blue-black needle single crystals about 2.3 x 0.5 x 0.1 mm. in dimensions with a density of 1.691 as determined at room temperature by flotation in carbon tetrachloride/bromoform mixtures.

*Analysis.*—Calcd. for $C_{16}H_{16}Cl_4N_2O_2$: C, 46.8%; H, 3.9%; Cl, 34.6%. Found: C, 46.0%; H, 3.9%; Cl, 35.5%.

(B) A needle single crystal of the above 1/1 chloranil/diaminodurene charge-transfer compound was treated with air-drying silver paint at both ends of the needle axis to serve as electrodes. These were connected by electrically conducting leads to a Wheatstone bridge. Using this instrument and an input of 1.5 volts D.C., the resistance across the single crystal was found to be 275,000 ohms. The single-crystal circuit element was attached to a thermally conducting, electrically insulated base in a vacuum and was cooled by the application of small amounts of liquid nitrogen to the said base. When the thus cooled circuit element had reached an equilibrium temperature, the resistance was again measured. Successive cooling and equilibration stages were continued, observing and recording the resistance, until the single-crystal circuit element had been cooled to about −60° C., at which point the resistance across the crystal had reached 10 megohms. From these results it was calculated that the resistivity increased exponentially with decreasing temperature with an activation energy of 0.25 ev., i.e., $R=R_0e^{E/kT}$ where E is the activation energy. This semiconductor-like activity of the single-crystal organic Lewis acid/Lewis base compounds shows them to be useful circuit elements, for example as thermistors.

*Example II*

A needle single crystal of the above 1/1 chloranil/diaminodurene compound was treated with air-drying silver paint on both ends of the needle to serve as electrodes. These were connected with two electrically conducting leads to a potentiometer. Provision was also made for heating a portion of one of the electrically conducting leads in contact with one end of the single needle crystal by an external resistance heating unit. The single-crystal circuit element was thus heated at one end and the voltage developed across the needle single crystal was measured. The temperature differential from one end of the crystal to the other was varied from 1° to 10° C., with the cold end being at room temperature. The cold end of the crystal became electrically positive with respect to the hot end. The voltage developed by the thermal gradient across the single-crystal circuit element was found to be 250–660 microvolts/° C.

A solution of 0.31 part of chloranil in about 215 parts of anhydrous boiling benzene was cooled to 30° C. in a glass reactor provided with glass fiber insulation, and a solution of 0.2 part of diaminodurene in about 44 parts of anhydrous benzene, also at 30° C., was added at once. The reactor was then closed and allowed to stand for two days. The resultant blue-black needle crystals of the 1/1 chloranil/diaminodurene charge transfer compound were removed by filtration and dried.

*Analysis.*—Calcd. for $C_{16}H_{16}Cl_4N_2O_2$: C, 46.8%; H, 3.9%. Found: C, 45.7%; H, 3.7%.

The volume resistivity was calculated from the resistance determined along the needle axis of the single crystal to be $1\times10^3$ ohm-cm. at room temperature. The thermoelectric power was determined as given above and was found to be from 920 to 1120 microvolts/° C.

The thermoelectric voltage developed by the single-crystal organic Lewis acid/Lewis base compounds thus shows them to be useful circuit elements for preparing thermoelectric generators.

*Example III*

(A) To a boiling solution of 0.128 part of TCNE in 112 parts of chloroform was added a room-temperature solution of 0.158 part of 1,5-diaminonaphthalene in 14.9 parts of chloroform. The resultant mixture was allowed to cool spontaneously to room temperature and the black shiny needles (about 4.0 x 0.2 x 0.2 mm.) of the product removed by filtration. After drying, there was thus obtained 0.10 part (35% of theory) of the 1/1 TCNE/DAN charge-transfer compound single crystals.

*Analysis.*—Calcd. for $C_{16}H_{10}N_6$: C, 66.9%; H, 3.5%; N, 29.5%. Found: C, 66.9%; H, 3.6%; N, 29.2%.

(B) A needle single crystal of the 1/1 tetracyanoethylene/1,5-diaminonaphthalene charge-transfer compound was provided with electrodes by putting a drop of an emulsion of graphite in oil at each end of the major axis of the crystal. These electrodes were connected with electrically conducting leads to a 1.5 volts D.C. source. A microammeter in the circuit in series with the single-crystal circuit showed the current passed at room temperature to be $1.65\times10^{-8}$ amps. The room temperature resistivity across the single-crystal circuit element was determined to be $1\times10^6$ ohm-cm. The single-crystal, circuit element, together with its associated electrodes, was cooled as described in Example I, and the current passed at the lower temperature measured. These steps were repeated again as in Example I until the single-crystal circuit element had been cooled to −34° C., at which point the current passed was $2.3\times10^{-10}$ amps. From these data it was calculated that the resistivity increased exponentially with decreasing temperature as in Example I with an activation energy of 0.5 ev.

*Example IV*

(A) To a solution of two parts of 7,7,8,8-tetracyanoqinodimethane (TCNQ) in 222 parts of anhydrous tetrahydrofuran was added 0.542 part of triethylamine. The solution immediately became orange-red in color and, on standing, gradually darkened and finally became deep green. After standing for 21 hours at room temperature, the reaction mixture was filtered to obtain 1.75 parts of the 2/1 tetracyanoquinodimethane/triethylammonium (TCNQ/TEA) charge-transfer compound as black crystals. Concentration of the filtrate afforded an additional 0.74 part of the charge-transfer compound. Total yield was thus 77% of theory. Recrystallization from acetonitrile afforded well-formed flat black rods of the charge-transfer compound about 2.0 x 0.5 x 0.2 mm. in dimensions which, on heating, decomposed with concomitant sublimation above 195° C. The crystals exhibited densities at room temperature of 1.206–1.211.

*Analysis.*—Calcd. for $C_{30}H_{24}N_9$: C, 70.6%; H, 4.9%; N, 24.7%. Found: C, 70.8%; H, 4.9%; N, 24.7%.

Slow recrystallization effected by mounting a closed glass reactor containing a hot saturated acetonitrile solution of the TCNQ/TEA compound in a hot water bath and allowing the bath to cool to room temperature slowly over a period of many hours afforded large rod crystals of the TCNQ/TEA compound about 10 x 5 x 1 mm. in dimensions.

(B) An acicular single crystal of the 2/1 tetracyanoquinodimethane/triethylammonium (TCNQ/TEA) charge-transfer compound was measured for volume resistivity in three diffferent directions between mutually opposite pairs of major crystal faces using both two-probe and four-probe methods as described at pages 265 and 266 of "Transistor Technology," vol. 1, edited by H. E. Bridgers, J. H. Scaff, and J. N. Schive, D. Van Nostrand Company, 1958. The resistivities found in the three directions were 0.4, 20.0, and 1,000 ohm-cm. The resistivities were determined as a function of temperature in the manner described previously in Example I. From these data it was calculated that the resistivity increased exponentially with decreasing temperature in all directions with an activation energy in the range 0.13–0.18 ev. In view of this three dimensional anisotropic conductivity, the single-crystal circuit element of the 2/1 TCNQ/TEA compound can be used as a transducer for a space position indicator.

*Example V*

The thermoelectric power of the above TCNQ/TEA single-crystal charge-transfer compound was measured in the manner of Example II but between all three pairs of mutually opposite major crystal faces. As in the case of the volume resistivity, the thermoelectric power is anisotropic, i.e., the voltage generated is a function of crystal orientation. In the direction of highest conductivity, the thermoelectric power is approximately 100 microvolts/° C. In the direction of lowest conductivity, the thermoelectric power is 45 microvolts/° C., and in the third direction, the thermoelectric power is about 16 microvolts/° C. In view of the anisotropic thermoelectric power, the single-crystal circuit element of the TCNQ/TEA compound can be used for an infrared or heat direction sensing device. The sign of the thermoelectric power indicates that electrons are the more mobile, or at least the dominant carrier, as opposed to the holes, and accordingly the TCNQ/TEA single-crystal charge-transfer compound is serving as an n-type semiconductor circuit component.

*Example VI*

(A) In a glass reactor a solution of 0.625 part of triethylmethylammonium iodide in a minimum of acetonitrile was added to a warm solution of one part of TCNQ in 160 parts of anhydrous tetrahydrofuran. A brilliant, deep-green color immediately developed. The reaction mixture was allowed to stand at room temperature for 1.5 hours and then concentrated under reduced pressure. When about 30 parts of solvent remained, a small amount of anhydrous diethyl ether was added, and the resultant mixture was filtered. There was thus obtained 0.84 part (65% of theory) of the 2/1 tetracyanoquinodimethane/triethylmethylammonium (TCNQ/TEMA) charge-transfer compound as dark crystals. Recrystallization from acetonitrile afforded the TCNQ/TEMA compound as black rods 0.2 x 0.5 x 3.4 mm. in dimensions, melting at 265–274° C. and exhibiting a density at room temperature of 1.201.

*Analysis.*—Calcd. for $C_{31}H_{26}N_9$: C, 71.0%; H, 5.0%; N, 24.0%. Found: C, 71.0%; H, 4.9%; N, 24.0%.

(B) By means of the techniques of the previous examples, the TCNQ/TEMA single crystal circuit element was found to exhibit a volume resistivity at 23° C. of $1.3–3.0\times10^4$ ohm-cm.

*Example VII*

(A) In a glass reactor 1.5 parts of tertiary butyldimethylamine was added to a mixture of 4.28 parts of TCNQ, 1.455 parts of p-phenylenedimalononitrile, and 400 parts of methylene chloride. The resulting dark green mixture was stirred under an atmosphere of nitrogen for 0.75 hour. Most of the solvent was removed by distillation under reduced pressure and the resultant residue was filtered. On drying, there was thus obtained 6.7 parts (94% of theory) of the 2/1 tetracyanoquinodimethane/tertiary butyldimethylammonium (TCNQ/BDMA) charge-transfer compound as black needles. Recrystallization from acetonitrile gave fine black needle crystals 0.50 x 0.07 x 1.30 mm. in dimensions exhibiting a density at room temperature of 1.211.

*Analysis.*—Calcd. for $C_{30}H_{24}N_9$: C, 70.6%; H, 4.9%; N, 24.7%. Found: C, 70.1%; H, 5.0%; N, 25.4%.

(B) By means of the techniques of the previous examples, the TCNQ/BDMA single-crystal circuit element was found to exhibit a volume resistivity at 25° C. with the current flowing along the ribbon axis of the crystal of 0.39 ohm-cm.

*Example VIII*

(A) To a hot (60° C.) solution of two parts of TCNQ in 180 parts of acetonitrile in a glass reactor was added with occasional swirling a room-temperature solution of four parts (excess) of methyltriphenylphosphonium iodide in about 50 parts of acetonitrile. The reactor was immediately closed and placed in a Dewar flask. After two minutes, a seed crystal of the 2/1 tetracyanoquinodimethane/methyltriphenylphosphonium (TCNQ/MTPP) charge-transfer compound was added and the flask again sealed and the Dewar covered. The reaction mixture was allowed to stand under these conditions for 16 hours and the resultant solid black crystals removed by filtration and washed rapidly with two about 10-part portions of acetonitrile and air-dried. There was thus obtained two parts (60% of theory based on TCNQ) of the TCNQ/MTPP charge transfer compound as black prisms 1 x 2 x 4 mm. in dimensions, melting at 231–233° C. with decompositions, and exhibiting a density at room temperature of 1.292.

*Analysis.*—Calcd. for $C_{43}H_{26}N_8P$: C, 75.3%; H, 3.8%; N, 16.3%; P, 4.5%. Found: C, 75.4%; H, 3.9%; N, 16.3%; P, 4.7%.

(B) By means of the techniques of the previous examples, the TCNQ/MTPP single-crystal circuit element was found to exhibit at room temperature resistivities of 60, 600, and $1\times10^5$ ohm-cm. in three different directions. The resistivity was shown to increase exponentially with decreasing temperature with an activation energy of 0.25 ev.

By means of the technique of Example II the thermoelectric power of the 2/1 TCNK/methyltriphenylphosphonium single-crystal, circuit-element was determined and was found at room temperature to be 70 microvolts/° C. n-type. As the single-crystal, circuit-element was cooled, the thermoelectric power gradually decreased with decreasing temperature to a value of zero at about 15° C. As the temperature of the needle single-crystal, circuit-component was still further lowered, the thermoelectric power became relatively large in the absolute value but was of different sign, i.e., was p-type. The thermoelectric power continued to increase in numerical value and remained p-type as the temperature was still further lowered until when the single-crystal circuit component had been cooled to about −20° C. the thermoelectric power had reached the value of 400 microvolts/° C.

*Example IX*

(A) The preparation of Example VIII was repeated, substituting a solution of 4.0 parts (excess) of ethyltriphenylphosphonium iodide for the methyltriphenylphosphonium iodide, varying further only in that the ethyltriphenylphosphonium iodide solution was added at 35° C. There was thus obtained 1.4 parts (41% of theory based on TCNQ) of the 2/1 tetracyanoquinodimethane/ethyltriphenylphosphonium (TCNQ/ETPP) charge transfer compound as black plates 0.16 x 2.4 x 4.6 mm. in dimensions, melting at 223–225° C. with decomposition, and exhibiting a density at room temperature of 1.284.

*Analysis.*—Calcd. for $C_{44}H_{28}N_8P$: C, 75.5%; H, 4.0%; N, 16.0%; P, 4.4%. Found: C, 75.8%; H, 4.2%; N, 15.9%; P, 4.5%.

(B) By means of the techniques of the preceding examples, the TCNQ/ETPP single-crystal circuit element was found to exhibit volume resistivities at room temperature in three directions, with the current flowing between opposite pairs of the six major crystal faces, respectively, of 9.3, about 10, and $3.7\times10^3$ ohm-cm.

*Example X*

(A) The preparation of Example IX was repeated, substituting 4.66 parts (100% excess based on TCNQ) of tetraphenylphosphonium iodide in 94 parts of acetonitrile for the acetonitrile solution of the ethyltriphenylphosphonium iodide. After standing for 40 hours in the Dewar, the reaction mixture was filtered and handled in the same way to afford 1.26 parts (33% of theory based on TCNQ) of the 2/1 tetracyanoquinodimethane/tetraphenylphosphonium (TCNQ/TPP) charge-transfer compound as black rod crystals 0.6 x 2.1 x 0.4 mm., melting at 228–237° C. with decomposition, and exhibiting a density at room temperature of 1.295.

*Analysis.*—Calcd. for $C_{38}H_{28}N_8P$: C, 77.1%; H, 3.8% N, 15.0%; P, 4.2%. Found: C, 76.7%; H, 4.0%; N, 16.1%; P, 4.3%.

(B) By means of the techniques of the preceding examples, the volume resistivity of the TCNQ/TPP single-crystal circuit element was found to be $1\times10^6$ and $2\times10^6$ ohm-cm. at room temperature in two different crystal dimensions.

*Example XI*

(A) The preparation of Example VIII was repeated, substituting 4.4 parts (2.0 molar proportions based on TCNQ) of methyltriphenylarsonium iodide for the methyltriphenylphosphonium iodide. After processing otherwise identically as in Example VIII, there was thus obtained two parts (56% of theory based on TCNQ) of the 2/1 tetracyanoquinodimethane/methyltriphenylarsonium (TCNQ/MTPA) charge-transfer compound as black, medium-large prisms 1.1 x 3.1 x 3.8 mm. in dimensions, melting at 224–227° C. with decomposition, and exhibiting a room temperature density of 1.397.

*Analysis.*—Calcd. for $C_{43}H_{26}N_8As$: C, 70.8%; H, 3.6%; N, 15.4%; As, 10.3%. Found: C, 71.6, 69.4%; H, 3.5%; N, 15.1%; As, 10.3%.

When slower crystal-growing techniques were employed, i.e., decreasing the temperature of the reaction mixture over an appreciably longer period of time, quite large single crystals of the TCNQ/MTPA charge-transfer compound were obtained, measuring up to 0.3 x 1.5 x 1.5 cm.

(B) By means of the techniques of the preceding examples, the TCNQ/MTPA single-crystal circuit element was found to exhibit volume resistivities at room temperature, with the current flowing between opposite pairs of the six major crystal faces of, respectively, 57, $9\times10^2$, and $1.6\times10^5$ ohm-cm.

(C) A single crystal (approximate dimensions 2.5 mm. x 1.0 mm. x 1.0 mm.) of the TCNQ/MTPA charge-transfer compound was mounted on a polymethyl methacrylate base. Electrical contacts were made to a pair of opposite faces using silver paint and the resistance of the crystal measured as 780,000 ohms. A resistor of 25,000 ohms (equivalent to the negative slope resistance of the crystal) and one of 100,000 ohms were placed in series with the crystal, and the three elements were connected to a source of variable D.C. power. The voltage output developed across the crystal and 25,000 ohm resistor pair was measured as a function of input voltage and current. A constant output voltage of 103.5 volts±1.5 v. was obtained, while the input voltage varied from 133 to 268 volts and the current flow varied from .3 to 1.64 ma. This test establishes the utility of the single-crystal charge-transfer compounds as a voltage regulator circuit element.

(D) The single crystal of the immediately-preceding paragraph was shielded from drafts and placed in a constant temperature box at 25° C. It was connected in series with a 36,000 ohm resistor, a 1,000 ohm resistor, a milliammeter and a 101 volt battery (FIGURE 5). The voltage drop across the 36,000 ohm resistor was 18.7 volts. When the switch 19 was depressed, a voltage of 1.5 volts was applied across the 1,000 ohm resistor, acting in the same direction as the battery voltage. The voltage across the 36,000 ohm resistor then increased to 37.9 volts. The output voltage across the 36,000 ohm resistor thus increased by 19.2 volts for an input signal of 1.5 volts, showing a voltage gain of 12.8, i.e., 21 db. This test establishes the utility of the single-crystal charge-transfer compounds as an amplifier circuit element.

*Example XII*

(A) To a hot (60° C.) solution of 0.612 part of TCNQ in about 55 parts of acetonitrile in a glass reactor was added a solution (60° C.) of 0.789 part (two molar proportions based on the TCNQ) of trimethylphenylammonium iodide in about 16 parts of acetonitrile. The reactor was immediately closed, and after two minutes a seed crystal of the 2/1 tetracyanoquinodimethane/trimethylphenylammonium (TCNQ/TMPA) charge-transfer compound was added. The closed reactor was then placed in a Dewar flask and allowed to stand for 24 hours. The resultant black prisms of the TCNQ/TMPA charge-transfer compound were removed by filtration, washed twice with acetonitrile, and air-dried. There was thus obtained 0.46 part (56% of theory based on TCNQ) of the TCNQ/TMPA charge-transfer compound as black prisms 0.5 x 1.3 x 1.5 mm. in dimensions, melting at 227–239° C. with decomposition.

*Analysis.*—Calcd. for $C_{33}H_{22}N_9$: C, 72.8%; H, 4.1%; N, 23.2%. Found: C, 72.7%; H, 4.1%; N, 23.2%.

(B) By means of the techniques of the preceding examples, the TCNQ/TMPA single-crystal circuit element was found to exhibit volume resistivities at room temperature in three directions, with the current flowing between opposite pairs of the six major crystal faces of, respectively, $7.4\times10^2$, $5.3\times10^3$, and $3.4\times10^4$ ohm-cm.

*Example XIII*

(A) The preparation of Example VIII was repeated, substituting 4.62 parts (2.0 molar proportions based on the TCNQ) of ethyltriphenylarsonium iodide for the 4.0 parts of the methyltriphenylphosphonium iodide of Example VIII. There was thus obtained 1.6 parts (44% of theory) of the 2/1 tetracyanoquinodimethane/ethyltriphenylarsonium (TCNQ/ETPA) charge-transfer compound as medium-sized black crystals 0.6 x 3.2 x 0.7 mm. in dimensions, melting at 212–219° C. with decomposition, and exhibiting a room temperature density of 1.342.

*Analysis.*—Calcd. for $C_{44}H_{28}N_8As$: C, 71.1%; H, 3.8%; N, 15.1%; As, 10.1%. Found: C, 71.1%; H, 4.0%; N, 14.8%; As, 10.3%.

(B) By means of the techniques of the preceding examples, the volume resistivity of the TCNQ/ETPA single-crystal circuit element was found to be 2.0 and $7\times10^3$ ohm-cm. at room temperature in two major crystal dimensions.

*Example XIV*

(A) To a hot (60° C.) solution of 1.02 parts of TCNQ in 58.5 parts of acetonitrile was added a hot (60° C.) solution of 2.78 parts (2.0 molar proportions based on the TCNQ) of tetraphenylstibonium iodide in about 16 parts of acetonitrile. The resulting mixture was allowed to stand at room temperature for one hour and the acetonitrile solvent removed by heating at steam bath temperatures until the volume of the liquid had been reduced to about 40% of its initial value. A seed crystal of the 2/1 tetracyanoquinodimethane/tetraphenylstibonium (TCNQ/TPS) charge-transfer compound was then added to the hot solution which was then let cool to room temperature. On filtration, there was thus obtained 0.87 part (42% of theory based on TCNQ) of the TCNQ/TPS charge-transfer compound as black rods 0.2 x 1.4 x 0.4 mm. in dimensions and melting at 219–220° C. with decomposition.

*Analysis.*—Calcd. for $C_{48}H_{28}N_8Sb$: C, 68.8%; H, 3.4%; N, 13.4%; Sb, 14.5%. Found: C, 69.1%; H, 3.7%; N, 14.6%; Sb, 14.4%.

(B) By means of the techniques of the preceding examples, the volume resistivity of the TCNQ/TPS single-crystal circuit element was found to be 13 and $1.5\times10^4$ ohm-cm. at room temperature in two major crystal dimensions.

*Example XV*

(A) To a solution of 0.1 part of TCNQ in 44 parts of boiling tetrahydrofuran was added a room-temperature solution of 0.15 part of 1,2-bis(methylthio)-1,2-bis(1-morpholino)-ethylene in 8.8 parts of tetrahydrofuran. The resultant mixture was allowed to stand at room temperature until most of the tetrahydrofuran solvent had evaporated. The resultant black, crystalline solid was collected on a filter and washed with methylene dichloride until the washings were colorless. There was thus obtained 0.12 part (68.5% of theory) of the 2/1 tetracyanoquinodimethane/1,2-bis(methylthio) - 1,2-bis(1-morpholino)ethylene (TCNQ/MTME) charge-transfer compound as black needles melting with decomposition at 182–192° C.

*Analysis.*—Calcd. for $C_{36}H_{30}N_{10}O_2S_2$: C, 69.9%; H, 4.4%; N, 20.4%. Found: C, 63.6%; H, 4.2%; N, 20.1%.

The charge-transfer compound exhibits a strong p-m-r absorption.

(B) By means of the techniques of the previous examples on crystals recrystallized from acetonitrile, the charge-transfer compound was found to exhibit a volume resistivity of 1.6–2.6 ohm-cm. By the same means, a 1/1 tetracyanoethylene/ferrocene single-crystal charge-transfer circuit element was found to exhibit at room temperature a volume resistivity of $6\times10^{10}$ ohm-cm.

The mechanism whereby single-crystal organic or organo-inorganic Lewis acid/Lewis base compounds operate as elements in the aforesaid described energy control and/or energy transfer devices is not known. It is possible that they are intrinsic semiconductors. It is also possible that they are extrinsic semiconductors functioning through trace impurities arising either from the solvents involved in growing the single crystals or else from either or both of the organic or organo-inorganic Lewis acid and Lewis base coreactants involved in preparing the charge-transfer compounds. In any event in addition to the foregoing specifically detailed circuit elements and devices, these organic and organo-inorganic Lewis acid/Lewis base charge-transfer compounds are fully useful as replacements for the presently commercially used germanium and silicon semiconductor elements in all known semiconductor devices.

In view of the wide versatility possible in electrical properties by virtue of the almost infinite number of changes arising through different substitution in one or both of the organic or organo-inorganic Lewis acid and Lewis base coreactants, these new single-crystal charge-transfer circuit elements are especially useful since a circuit element of desired electrical properties can be tailor-made with almost pinpoint accuracy. In addition, the electrical properties can be widely modified through doping techniques, permitting also the preparation of either or both n- and/or p-type semiconductor circuit elements.

While the exact mechanism of the electrical behavior of these new single-crystal organic circuit elements is not known, it is known that the electrical conductivity which they exhibit is electronic in nature. For example, a 0.0002 g. single crystal of the 1/1 chloranil/diaminodurene charge-transfer compound was fitted with silver electrodes as in the preceding examples and connected by electrically conducting leads to a source of D.C. voltage with an ammeter in circuit and the voltage adjusted so that the current passing across the single crystal circuit element was 125 microamperes. Current was passed for a total of 66 hours, at which time it had dropped to a value of 100 microamperes. Based on these data, a total charge of $2.5\times10^{-4}$ Faradays was passed through the crystal, which from the 1:1 stoichiometry and the indicated weight contained $5\times10^{-7}$ moles of material. Thus, $0.5\times10^{3}$ times as much current was passed as there were moles of material present, and accordingly conduction must be electronic in nature. The same is true for the other single-crystal, charge-transfer circuit elements, particularly those based on TCNQ, which elements are preferred.

One very important advantage the present single-crystal circuit elements exhibit over the prior art powder compacts of polycrystals of organic complexes, which have shown some interesting electrical properties, is that the present single-crystal circuit elements exhibit anisotropic electrical behavior. This is not so with the powder compacts which necessarily exhibit in all directions electrical properties which are a statistical average of the anisotropic electrical properties exhibited by the present single crystals. The order of magnitude of the values for the various electrical properties exhibited by the powder compacts will necessarily have to be greater than the corresponding value in the single-crystal circuit elements along the minimum axis of the crystal and will generally be equal to or greater than the specific value of the property involved along the median axis of the anisotropic single crystals. Thus, to cite but a single instance, the TCNQ/TEA single-crystal circuit element of Example IV exhibits volume resistivities at room temperature in the three major crystal axes between each pair of major crystal faces of 0.4, 20.0, and 1,000 ohm-cm. Powder compacts of the same materials, unlike the single crystals, exhibited volume resistivities at room temperature of about 20 ohm-cm. in all directions.

Since obvious modifications and equivalents in the invention will be evident to those skilled in the chemical arts, we propose to be bound solely by the appended claims.

The embodiments of the invention in which an exclusive property or privilege is claimed are defined as follows:

1. A circuit element formed from at least one anisotropic single crystal of a large-transfer compound of a member of the group consisting of aprotonic organic and organo-inorganic Lewis acids with a member of the group consisting of anhydroxidic organic and organo-inorganic Lewis bases, said single crystal exhibiting a detectable paramagnetic resonance absorption.

2. The circuit element of claim 1 wherein the Lewis acid is a substituted quinodimethane.

3. The circuit element of claim 1 wherein the Lewis base is an amine.

4. The circuit element of claim 1 wherein the Lewis base is a phosphine.

5. A circuit element formed from an anisotropic single crystal of a tetracyanoquinodimethane/triethylammonium charge-transfer compound.

6. A circuit element formed from an anisotropic single crystal of a tetracyanoquinodimethane/methyltriphenylphosphonium charge-transfer compound.

7. An anisotropic circuit element formed from a single crystal of a tetracyanoquinodimethane/triethylammonium charge-transfer compound.

8. An article of manufacture comprising (1) at least one anisotropic single crystal of a charge-transfer compound of a member of the group consisting of aprotonic organic and organo-inorganic Lewis acids with a member of the group consisting of anhydroxidic organic and organo-inorganic Lewis bases, said single crystal exhibiting a detectable paramagnetic resonance absorption, and (2) electrically conductive means in contact therewith.

9. An article of manufacture comprising (1) an anisotropic single crystal of a tetracyanoquinodimethane/triethylammonium charge-transfer compound and (2) electrically conductive means in contact therewith.

10. An article of manufacture comprising (1) an anisotropic single crystal of a tetracyanoquinodimethane/methyltriphenylphosphonium charge-transfer compound and (2) electrically conductive means in contact therewith.

11. An article of manufacture comprising (1) an anisotropic single crystal of a tetracyanoquinodimethane/methyltriphenylarsonium charge-transfer compound and (2) electrically conductive means in contact therewith.

12. In an electrical circuit, (1) a circuit element formed from at least one anisotropic single crystal of a charge-transfer compound of a member of the group consisting of aprotonic organic and organo-inorganic Lewis acids with a member of the group consisting of anhydroxidic organic and organo-inorganic Lewis bases, said single crystal exhibiting a detectable paramagnetic resonance absorption, and (2) electrically conductive means establishing contact between said circuit element and the remainder of the circuit.

13. A thermoelectric generator comprising an anisotropic single crystal of a charge-transfer compound of a member of the group consisting of aprotonic organic and organo-inorganic Lewis acids with a member of the group consisting of anhydroxidic organic and organo-inorganic Lewis bases, said single crystal exhibiting a detectable paramagnetic resonance absorption and, in electrically conductive contact therewith, allied conductive means.

14. A modulator comprising an anisotropic single crystal of a charge-transfer compound of a member of the group consisting of aprotonic organic and organo-inorganic Lewis acids with a member of the group consisting of anhydroxidic organic and organo-inorganic Lewis bases, said single crystal exhibiting a detectable paramagnetic resonance absorption and, in electrically conductive contact therewith, allied conductive means.

15. A voltage regulator comprising an anisotropic single crystal of a charge-transfer compound of a member of the group consisting of aprotonic organic and organo-inorganic Lewis acids with a member of the group consisting of anhydroxidic organic and organo-inorganic Lewis bases, said single crystal exhibiting a detectable paramagnetic resonance absorption and, in electrically conductive contact therewith, allied conductive means.

16. An amplifier for producing amplification of an electrical input signal comprising an anisotropic single crystal of a charge-transfer compound of a member of the group consisting of aprotonic organic and organo-inorganic Lewis acids with a member of the group consisting of anhydroxidic organic and organo-inorganic Lewis bases, said single crystal exhibiting a detectable paramagnetic resonance absorption and, in electrically conductive contact therewith, allied conductive means.

References Cited by the Examiner

UNITED STATES PATENTS 3,013,214 12/1961 Damon ---------------- 330—4

OTHER REFERENCES

"Research" (Eley), London, 1959, volume 12, pages 293–299.

JOHN W. HUCKERT, *Primary Examiner.*

JOHN H. MACK, GEORGE N. WESTBY, *Examiners.*

J. BARNEY, L. ZALMAN, *Assistant Examiners.*